US012812809B2

(12) United States Patent
Strittmatter et al.

(10) Patent No.: US 12,812,809 B2
(45) Date of Patent: Nov. 24, 2026

(54) PRINTED CIRCUIT BOARD FOR AN AUTOMATION FIELD DEVICE

(71) Applicant: Endress+Hauser SE+Co. KG, Maulburg (DE)

(72) Inventors: Christian Strittmatter, Rickenbach (DE); Vitogiuseppe Di Cosola, Hartheim (DE); Andreas Kaiser, Todtnau (DE); Hamid Reza Shahi, Lörrach (DE); Jens Krause, Müllheim (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 242 days.

(21) Appl. No.: 18/696,426

(22) PCT Filed: Sep. 22, 2022

(86) PCT No.: PCT/EP2022/076360
§ 371 (c)(1),
(2) Date: Mar. 28, 2024

(87) PCT Pub. No.: WO2023/057223
PCT Pub. Date: Apr. 13, 2023

(65) Prior Publication Data

US 2025/0048578 A1 Feb. 6, 2025

(30) Foreign Application Priority Data

Oct. 6, 2021 (DE) ..................... 10 2021 125 881.2

(51) Int. Cl.
*H05K 1/181* (2026.01)
*H05K 1/02* (2006.01)
(Continued)

(52) U.S. Cl.
CPC ........... *H05K 5/064* (2013.01); *H05K 1/0259* (2013.01); *H05K 1/181* (2013.01); *H05K 3/284* (2013.01);
(Continued)

(58) Field of Classification Search
CPC .................. H05K 1/02; H05K 1/0213; H05K 1/0254–0259; H05K 1/18;
(Continued)

(56) References Cited

U.S. PATENT DOCUMENTS 4,814,943 A * 3/1989 Okuaki ................. H10W 76/47 257/E23.125
8,716,846 B2 * 5/2014 Yao ..................... G01L 19/0069 257/E23.126
(Continued)

FOREIGN PATENT DOCUMENTS

CN 105671394 A 6/2016
CN 110970150 A 4/2020
(Continued)

OTHER PUBLICATIONS

Zhou, et al., Liquid metal antenna-based pressure sensor, IOP Publishing, Smart Mater. Struct. 28 (2019) 025019 (11 pp.).
(Continued)

*Primary Examiner* — Tuan T Dinh
(74) *Attorney, Agent, or Firm* — Kelly J. Smith; Endress+Hauser (USA) Holding, Inc.

(57) ABSTRACT

A field device circuit board includes a plurality of electronic components and a potting compound container made of a plastic and having a peripheral side wall defining an outer contour of the potting compound container, and a potting compound cover adjoining the side wall and an opening located on the potting compound cover far side. The potting compound container is set via the opening over the plurality
(Continued)

of electronic components and filled with a potting compound such that the electronic components covered by the potting compound have a predetermined minimum covering, wherein the potting compound container is not completely filled with potting compound and wherein in the potting compound cover in an edge region, which borders a transition from the side wall to the potting compound cover, a gap is present, which extends over a convex edge region of the outer contour.

10 Claims, 2 Drawing Sheets

(51) Int. Cl.
*H05K 3/28* (2006.01)
*H05K 5/06* (2006.01)

(52) U.S. Cl.
CPC .............. *H05K 2201/10522* (2013.01); *H05K 2203/0228* (2013.01)

(58) Field of Classification Search
CPC . H05K 1/181–186; H05K 2201/10181; H05K 2201/10022; H05K 2201/10166; H05K 2201/10015; H05K 2201/10356; H05K 3/284
USPC ........................ 361/782–784, 795, 816, 818; 257/685–690, 787–790; 174/350, 520
See application file for complete search history.

(56) References Cited

U.S. PATENT DOCUMENTS

| | | | | |
|---|---|---|---|---|
| 10,134,682 | B2 * | 11/2018 | Kumbhat | H10W 42/20 |
| 2005/0189621 | A1 * | 9/2005 | Cheung | B81C 1/00293 257/659 |
| 2009/0045498 | A1 * | 2/2009 | Braden | H10W 76/47 257/687 |
| 2016/0047774 | A1 * | 2/2016 | Teysseyre | G01N 27/128 204/406 |
| 2017/0117229 | A1 * | 4/2017 | Kumbhat | H10P 14/412 |
| 2020/0066610 | A1 * | 2/2020 | Strütt | H05K 1/0268 |

FOREIGN PATENT DOCUMENTS

| | | | |
|---|---|---|---|
| CN | 211061103 | U | 7/2020 |
| DE | 102004052950 | A1 | 5/2006 |
| DE | 102009016762 | B4 | 10/2010 |
| DE | 102015208486 | A1 | 11/2016 |
| DE | 102017218131 | B4 | 4/2019 |
| DE | 102019123325 | A1 | 3/2021 |
| JP | 8250868 | A | 9/1996 |
| JP | 2010153448 | A | 7/2010 |
| NL | 1037176 | C2 | 2/2011 |

OTHER PUBLICATIONS

Yang, et al., Electronic Skins based on Liquid Metals, Proceedings of the IEEE, vol. 107, No. 10, Oct. 2019, pp. 2168-2184.

Ergeneman, et al., A Magnetically Controlled Wireless Optical Oxygen Sensor for Intraocular Measurements, IEEE Sensors Journal, vol. 8, No. 1, Jan. 2008, pp. 29-38.

* cited by examiner

PRINTED CIRCUIT BOARD FOR AN AUTOMATION FIELD DEVICE

CROSS-REFERENCE TO RELATED APPLICATIONS

The present application is related to and claims the priority benefit of DPMA Patent Application No. 10 2021 125 881.2, filed on Oct. 6, 2021, and International Patent Application No. PCT/EP2022/076360, filed Sep. 22, 2022, the entire contents of which are incorporated herein by reference.

TECHNICAL FIELD

The invention relates to a circuit board for a field device of automation technology as well as to a field device of automation technology having such a circuit board.

BACKGROUND

In automation technology plants, especially in process automation plants, field devices are often applied, which serve for registering and/or influencing process variables. Serving for registering process variables are sensors, which are used, for example, in fill level measuring devices, flowmeters, pressure- and temperature measuring devices, pH-redox potential measuring devices, conductivity measuring devices, etc. for registering the corresponding process variables, fill level, flow, pressure, temperature, pH value, and conductivity. Serving for influencing process variables are actuators, such as, for example, valves or pumps, via which the flow of a liquid in a pipeline section, or the fill level in a container, can be changed. Referred to as field devices are, in principle, all devices, which are applied near to a process and which deliver, or process, process relevant information. In connection with the invention, the terminology, field devices, thus, refers also to remote I/Os, radio adapters, and, in general, devices, which are arranged at the field level. A large number of such field devices are manufactured and sold by the firm, Endress+Hauser.

In order to enable the electrical, or electronic, functionality of such field devices, corresponding circuit boards with electrical, or electronic, components are applied in the interior of the field device to form the field device electronics.

Field devices thus often have a sensor unit, especially a sensor unit at least at times and/or at least sectionally in contact with a process medium, in order to produce a signal dependent on the process variable. Furthermore, field devices often include an electronics arranged in a transmitter housing, wherein the electronics serves for processing and/or forwarding signals, especially electrical and/or electronic signals, produced by the sensor unit. Typically, the electronics includes at least one circuit board with components arranged thereon.

Field devices, especially their electronics, that are qualified to be operated in explosion endangered regions (Ex regions), must satisfy very high safety requirements regarding explosion protection. In such case, of concern, especially, is safely to prevent the forming of sparks or at least to assure that a spark arisen due to a malfunction has no effects reaching to the environment. For this, corresponding standards are defined with a series of associated protection classes, especially in European standard IEC 600079-11 and/or EN60079-11.

In the protection class, "increased safety" (Ex-e), explosion protection is obtained by spatial separation between two different electrical potentials sufficiently large that, due to the separation, a spark formation cannot occur, even in the case of malfunction. Use of a potting compound encapsulation of electronic components falls under the protection class "Ex-m" in the context of the above-mentioned standards. In the protection class, "intrinsic safety" (Ex-i), explosion protection is obtained using values for an electrical variable (electrical current, voltage, power) lying in each case and at all times below predetermined limit values, in order that even in the case of malfunction no ignition sparks are produced.

Comparable protection classes are defined in the American standard FM3610 and/or the ANSI/UL 60079-11 and/or the Canadian standard CAN/CAS C22.2 No. 60079-11.

Another requirement is that the field devices in an explosive atmosphere are allowed to operate only when their surface temperature remains below an ignition temperature of the surrounding explosive mixture. For this, temperature classes are defined. For example, in the case of the temperature class T6, surface temperature must not exceed 85° C.

In order to be able to reduce the needed spatial separations mentioned in the above-mentioned standards, fixed insulation can be provided where required.

This is usually done with the aid of a potting compound. In order to apply this liquid potting compound on the circuit board, however, a potting compound container, or housing, is required, in order that the potting compound retains a desired shape until it becomes hardened.

According to the protection class "intrinsic safety" (Ex-i; EN60079-11), the covering with a potting compound must be at least 1 mm thick.

Disadvantageous in the use of a potting compound is that such changes its volume as a function of temperature. In the case of a decrease of temperature, the potting compound shrinks and in the case of an increase of temperature, the potting compound expands.

This has the result that forces arise in the potting compound container (to the extent that the potting compound has no free space), in order to handle the volume change. Thus, there act, due to the contraction of the potting compound and supplementally also due to clinging effects, or adhesive bond effects, on wall- and/or cover regions of the potting compound container, upon temperature increase, compressive forces, and, upon temperature decrease, tensile forces on the electronic components. Tensile- or compressive forces that are too high can result in cracks in the potting compound, since, for example, silicone rubber as potting compound has a limited ability to strain.

Another disadvantage is that upon temperature decrease the necessary 1 mm covering required for EX-qualification can no longer be assured, due to deformation of the potting compound and/or crack formation.

In order to be able to accommodate the volume change associated with temperature changes and to avoid possible forces between the potting compound, the potting compound container and the circuit board, usually, an intermediate space between the potting compound container and the filled potting compound is kept free, such that upon a temperature rise the potting compound can expand and upon a temperature drop the potting compound can contract.

When an intermediate space between the potting compound container and the filled potting compound is kept free, it can, however, occur that the potting compound because of capillary forces climbs the side walls of the potting compound container in the direction of the potting compound cover and as soon as the potting compound reaches the potting compound cover, it can, at least partially, occupy the intermediate space. This, in turn, has the result that potting compound is missing in the central region, and, thus, the covering necessary for EX-qualification cannot be assured at all locations.

SUMMARY

An object of the invention is, therefore, to provide measures for how, in the potting of electronic components on a circuit board with the aid of a potting compound container, a covering necessary for EX-qualification can be assured.

The object is achieved by the circuit board and the field device of automation technology as defined in the present disclosure.

The circuit board of the invention for a field device of automation technology comprises a plurality of electronic components and a potting compound container made of a plastic and having a peripheral side wall defining an outer contour of the potting compound container, a potting compound cover adjoining the side wall and an opening located on the potting compound cover far side, wherein the potting compound container is set via the opening over at least a part of the plurality of electronic components and filled with a potting compound in such a manner that electronic components covered by potting compound have a predetermined, or defined, minimum covering, wherein the potting compound container is, however, not completely filled with potting compound and wherein in the potting compound cover in an edge region, which borders a transition from the side wall to the potting compound cover, at least one gap is present, which extends at least over a convex edge region of the outer contour.

According to the invention, there is provided at least one convex edge region, preferably at all convex edge regions, of the potting compound container, at least one gap in the potting compound cover, in order to suppress capillary action and to prevent that the potting compound migrates on the potting compound cover. Such a convex edge region can be, for example, a corner or a rounding of the potting compound container. The arrangement of the one or more gaps is, in such case, as near as possible to the transition from the side wall to the cover of the potting compound container in an edge region of the potting compound cover.

An advantageous embodiment of the circuit board of the invention can provide that a breadth of the at least one gap is such that the at least one gap has a minimum gap breadth of at least 0.5 mm, preferably at least 1 mm, especially preferably at least 2 mm.

Another advantageous embodiment of the circuit board of the invention can provide that a breadth of the at least one gap is such that the at least one gap has a maximum gap breadth of no more than 6 mm, preferably no more than 5 mm, especially preferably no more than 4 mm.

In turn, another advantageous embodiment of the circuit board of the invention can provide that a length of the at least one gap is such that the at least one gap extends at least over a convex edge region of the outer contour.

Another advantageous embodiment of the circuit board of the invention can provide that the potting compound container has in the potting compound cover a plurality of gaps located, in each case, in the edge region. Especially, the embodiment can provide that the number of gaps in the edge region of the potting compound cover is such that they extend essentially completely along the outer contour and are only interrupted by at least one land, preferably at least two lands, especially preferably at least three lands and/or that the at least one land has a minimum width of at least 0.5 mm, preferably of at least 1 mm, especially preferably at least 2 mm, separating gaps from one another.

Another advantageous embodiment of the circuit board of the invention can provide that the one or more gaps are formed by an injection molding method, a blanking method, a milling method or a laser cutting method.

Another advantageous embodiment of the circuit board of the invention can provide that the predetermined, or defined, minimum covering results from the standard, DIN EN60079-11, published June 2012, Explosive Atmospheres—Part 11: Equipment Protection by Intrinsic Safety "i" and/or amounts preferably to 1 mm.

BRIEF DESCRIPTION OF THE DRAWINGS

The present disclosure will now be explained in greater detail based on the appended drawing, the figures of which show as follows.

DETAILED DESCRIPTION

Figure 1:
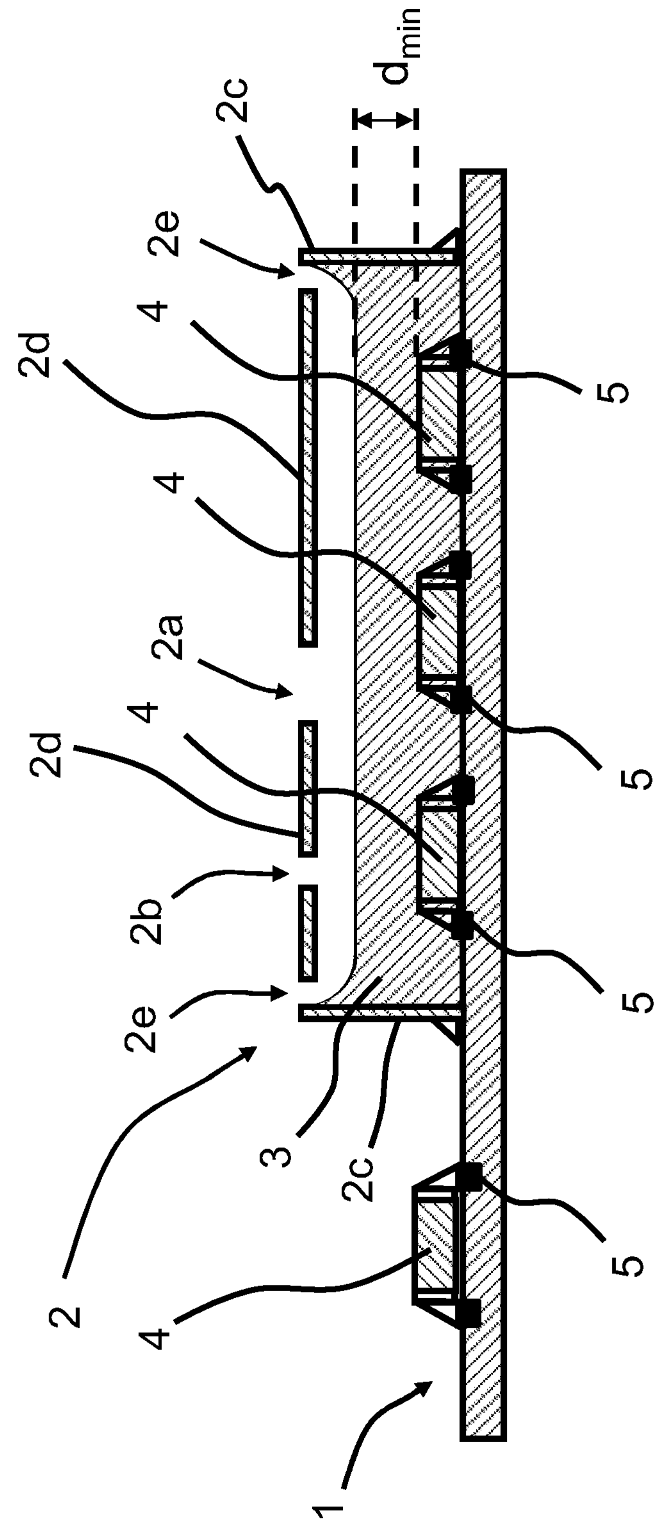
FIG. 1 shows a schematic view of a cross section of a circuit board for a field device of automation technology, populated with electronic components and potted by means of a potting compound container of the present disclosure containing a potting compound.

FIG. 1 shows a schematic view of a cross section of a circuit board 1 for a field device of automation technology, populated with electronic components and potted by means of a potting compound container of the invention containing a potting compound. Circuit board 1 can comprise a plurality of electronic components 4, at least, however, one electronic component, potted by means of a potting compound. The electronic components 4 can be, for example, SMD (Surface Mounted Device) components, which are mounted on the circuit board 1 in an SMD process. The electronic components 4 can be set on the circuit board 1, for example, using an automatic pick-and-place machine. For this, solder paste and/or adhesive 5 are/is first placed on the circuit board 1 at the appropriate positions, where the electronic components 4 are to be applied, and then the electronic components 4 are soldered in place and in given cases, supplementally adhered. Additionally, solder paste and/or adhesive 5 can also be provided, where the potting compound container 2 is to be provided later, in order that such can later also be mechanically secured, and held permanently.

The potting compound container 2 is a plastic potting compound container 2 for placement over the electronic components. Potting compound container 2 includes a surrounding side wall 2*c* and a container cover 2*d*, which adjoins the side wall 2*c*. On a container cover 2*d* far side, the potting compound container is open, such that it can be set via the open side on the circuit board 1 over the electronic components to be potted.

In order to enable a filling of the potting compound container 2 after its placement on the circuit board 1, at least one filling opening 2*a* is provided in the potting compound container 2, via which the potting compound 3 can be fed in. To aid in this, at least one air escape opening 2*b* can be provided in the potting compound container 2.

Potting compound container 2 is filled with a potting compound 3, wherein the potting compound container is not completely filled with potting compound 3, but, instead, only to the extent that each electronic component under the potting compound container has at least a minimum covering $d_{min}$ of potting compound. In such case, the minimum covering $d_{min}$ is governed by the standard, DIN EN60079-11, published June 2012, Explosive Atmospheres—Part 11: Equipment Protection by Intrinsic Safety "i". For example, the minimum covering can amount to 1 mm, such that all electronic components are covered by at least 1 mm thickness of potting compound.

Figure 2:
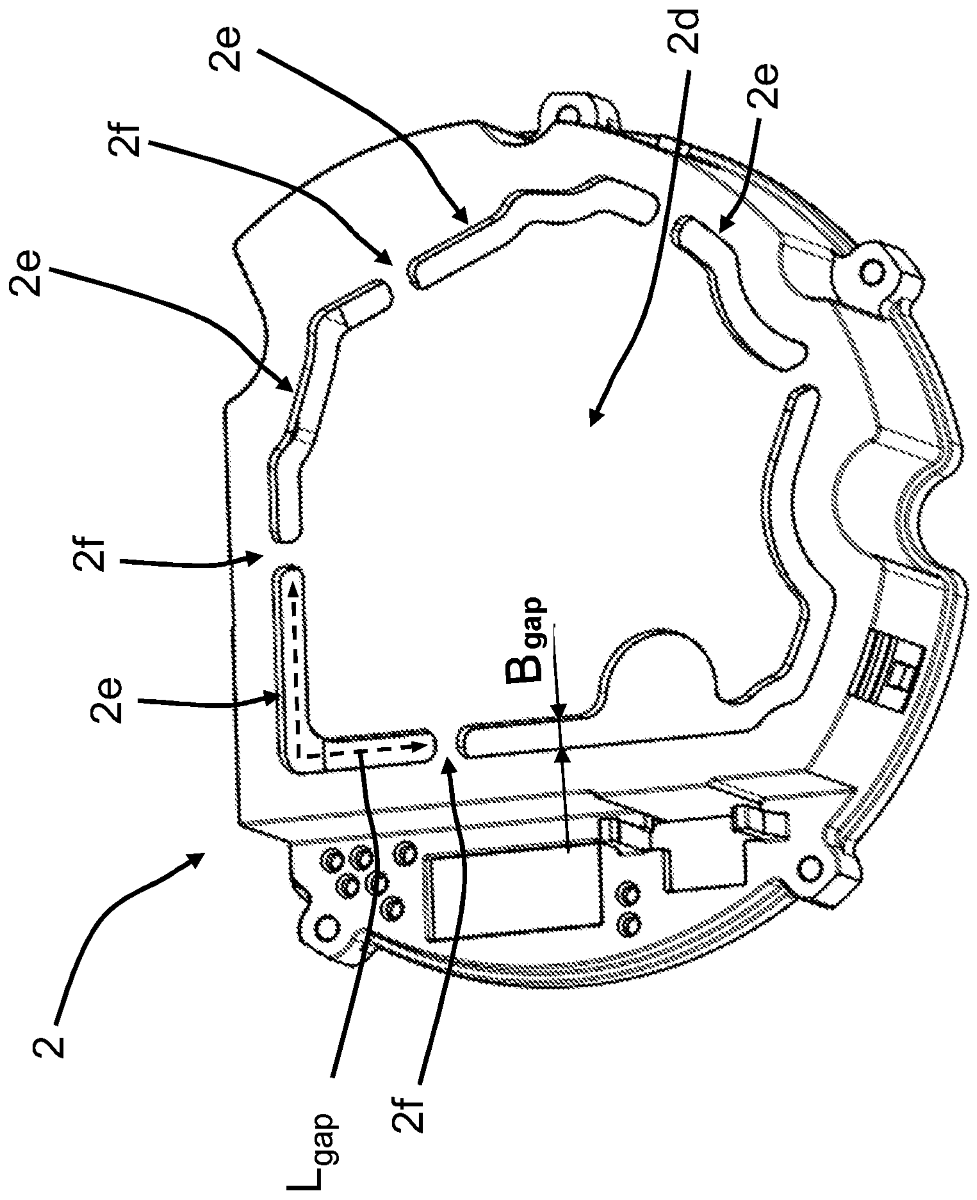
FIG. 2 shows an example of an embodiment of a potting compound container of the present disclosure.

FIG. 2 shows a potting compound container 2 of the invention, in which there are a plurality of gaps 2*e* in the cover 2*d*. The gaps 2*e* serve to suppress capillary action, such that the potting compound 3 can only reach the gaps 2*e* at the side wall 2*c*. The gaps 2*e* are, in such case, preferably arranged in the edge region of the cover 2*d* at the transition to the side wall 2*c* of the potting compound container 2. Ideally, the gaps 2*e* are arranged directly at the transition from the side wall 2*c* to the potting compound cover 2*d*. The minimum separation, in such case, is limited only by the method by which the gaps are produced.

As regards the breadth $B_{gap}$ of the gaps, such is selected such that the minimum gap breadth is at least 0.5 mm, preferably at least 1 mm, especially preferably greater than or equal to 2 mm and/or the maximum gap breadth is not greater than 6 mm, preferably not greater than 5 mm, especially preferably not greater than 4 mm. As regards the length $L_{gap}$ of the gaps, such is preferably selected in such a manner that the gaps 2*e* extend, in each case, at least over a convex edge region of the outer contour, such as, for example, a corner, of the potting compound container, such as shown in FIG. 2 by a dashed arrow. In a special embodiment, the gaps 2*e* are formed in the cover 2*d* in such a manner that they extend essentially along an outer contour of the side wall of the potting compound container 2. This means that the individual gaps form virtually a peripheral gap, which is interrupted only by at least one land. For stability of the cover, however, also more than one gap, for example, at least two or at least three gaps, can be present, e.g. the peripheral gap can be interrupted by spaced lands 2*f*.

The lands 2*f* serve, in such case, for mechanically stabilizing the cover 2*d*, such that the cover 2*d* offers, on the one hand, a certain protection against mechanical effects, and, on the other hand, the gap, e.g. the almost complete peripheral gap, prevents migration of the potting compound. Mechanical effects can arise, for example, during installation and/or replacement of the prefabricated circuit board in a field device.

The one or more gaps 2*e* can be formed, for example, directly during the manufacturing of the potting compound container 2, in that they are correspondingly provided for in an injection molding tool/die for the potting compound container 2. Alternatively, the gaps 2*e* can also be introduced into the potting compound container 2 after the molding of the potting compound container 2, for example, as a result of milling, blanking or by means of a laser.

LIST OF REFERENCE CHARACTERS

1 circuit board
2 potting compound container
2*a* filling opening
2*b* air escape opening
2*c* side wall of the potting compound container
2*d* cover of the potting compound container
2*e* gap(s)
2*f* land(s)

3 potting compound
4 electronic components
5 solder paste
$d_{min}$ minimum covering
$B_{gap}$ breadth of the gap
$L_{gap}$ length of the gap

The invention claimed is:

1. A circuit board for a field device of automation technology comprising a plurality of electronic components and a potting compound container made of a plastic and having a peripheral side wall defining an outer contour of the potting compound container, a potting compound cover adjoining the side wall and an opening located on the potting compound cover far side, wherein the potting compound container is set via the opening over at least a part of the plurality of electronic components and filled with a potting compound in such a manner that electronic components covered by potting compound have a predetermined, or defined, minimum covering, wherein the potting compound container is, however, not completely filled with potting compound and wherein in the potting compound cover in an edge region, which borders a transition from the side wall to the potting compound cover, at least one gap is present, which extends at least over a convex edge region of the outer contour, wherein the potting compound container is open on the side facing away from the cover.

2. The circuit board as claimed in claim 1, wherein a breadth of the at least one gap is such that the at least one gap has a minimum gap breadth of at least 0.5 mm.

3. The circuit board as claimed in claim 1, wherein a breadth of the at least one gap is such that the at least one gap has a maximum gap breadth of no more than 6 mm.

4. The circuit board as claimed in claim 1, wherein a length of the at least one gap is such that the at least one gap extends at least over a convex edge region of the outer contour.

5. The circuit board as claimed in claim 1, wherein the potting compound container has in the potting compound cover a plurality of gaps located, in each case, in the edge region.

6. The circuit board as claimed in claim 5, wherein the number of gaps in the edge region of the potting compound cover is such that they extend completely along the outer contour and are only interrupted by at least one land.

7. The circuit board as claimed in claim 6, wherein the at least one land has a minimum width of at least 0.5 mm.

8. The circuit board as claimed in claim 1, wherein the one or more gaps are formed by an injection molding method, a blanking method, a milling method or a laser cutting method.

9. The circuit board as claimed in claim 1, wherein the predetermined, or defined, minimum covering results from the standard, DIN EN60079-11, published June 2012, Explosion Atmospheres-part 11: Equipment Protection by Intrinsic Safety "i" and/or amounts preferably to 1 mm.

10. A field device of automation technology, including:

a circuit board for the field device of automation technology comprising a plurality of electronic components and a potting compound container made of a plastic and having a peripheral side wall defining an outer contour of the potting compound container, a potting compound cover adjoining the side wall and an opening located on the potting compound cover far side, wherein the potting compound container is set via the opening over at least a part of the plurality of electronic components and filled with a potting compound in such a manner that electronic components covered by potting compound have a predetermined, or defined, minimum covering, wherein the potting compound container is, however, not completely filled with potting compound and wherein in the potting compound cover in an edge region, which borders a transition from the side wall to the potting compound cover, at least one gap is present, which extends at least over a convex edge region of the outer contour, wherein the potting compound container is open on the side facing away from the cover.

* * * * *